(12) United States Patent
Onishi et al.

(10) Patent No.: US 11,501,971 B2
(45) Date of Patent: Nov. 15, 2022

(54) MANUFACTURING METHOD OF SILICON CARBIDE SEMICONDUCTOR DEVICE AND SILICON CARBIDE SEMICONDUCTOR DEVICE

(71) Applicant: DENSO CORPORATION, Kariya (JP)

(72) Inventors: Toru Onishi, Nagoya (JP); Katsuhiro Kutsuki, Nagakute (JP); Kensaku Yamamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 178 days.

(21) Appl. No.: 16/968,706

(22) PCT Filed: Jan. 29, 2019

(86) PCT No.: PCT/JP2019/002879
§ 371 (c)(1),
(2) Date: Aug. 10, 2020

(87) PCT Pub. No.: WO2019/159680
PCT Pub. Date: Aug. 22, 2019

(65) Prior Publication Data
US 2021/0013039 A1    Jan. 14, 2021

(30) Foreign Application Priority Data

Feb. 16, 2018   (JP) .............................. JP2018-026043

(51) Int. Cl.
*H01L 21/02*  (2006.01)
*H01L 21/04*  (2006.01)
(Continued)

(52) U.S. Cl.
CPC ...... *H01L 21/049* (2013.01); *H01L 21/02236* (2013.01); *H01L 21/02255* (2013.01);
(Continued)

(58) Field of Classification Search
CPC ............. H01L 21/049; H01L 21/02236; H01L 21/02255; H01L 21/02271; H01L 29/1608;
(Continued)

(56) References Cited

U.S. PATENT DOCUMENTS

2012/0217513 A1* 8/2012 Tega ................... H01L 21/0485
257/77
2012/0223338 A1   9/2012 Mitani et al.
(Continued)

FOREIGN PATENT DOCUMENTS

EP   2 833 409 A1   2/2015
JP   2008-117878 A  5/2008
(Continued)

OTHER PUBLICATIONS

International Search Report of the International Searching Authority dated Apr. 10, 2019 for the corresponding International application No. PCT/JP2019/002879.

*Primary Examiner* — Kyoung Lee
(74) *Attorney, Agent, or Firm* — Posz Law Group, PLC

(57) ABSTRACT

A manufacturing method of a silicon carbide semiconductor device may include: forming a gate insulating film on a silicon carbide substrate; and forming a gate electrode on the gate insulating film. The forming of the gate insulating film may include forming an oxide film on the silicon carbide substrate by thermally oxidizing the silicon carbide substrate under a nitrogen atmosphere.

5 Claims, 5 Drawing Sheets

(51) Int. Cl.
  *H01L 29/16* (2006.01)
  *H01L 29/423* (2006.01)
  *H01L 29/51* (2006.01)
  *H01L 29/66* (2006.01)
  *H01L 29/78* (2006.01)

(52) U.S. Cl.
  CPC .... *H01L 21/02271* (2013.01); *H01L 29/1608* (2013.01); *H01L 29/42364* (2013.01); *H01L 29/513* (2013.01); *H01L 29/66068* (2013.01); *H01L 29/7802* (2013.01)

(58) Field of Classification Search
  CPC ............. H01L 29/42364; H01L 29/513; H01L 29/66068; H01L 29/7802; H01L 21/0214; H01L 21/02164; H01L 21/02178; H01L 21/022; H01L 21/0228; H01L 29/518; H01L 29/7395
  See application file for complete search history.

(56) References Cited

U.S. PATENT DOCUMENTS

| | | |
|---|---|---|
| 2013/0309877 A1 | 11/2013 | Tanimoto et al. |
| 2015/0303271 A1 | 10/2015 | Tanaka et al. |

FOREIGN PATENT DOCUMENTS

| | | |
|---|---|---|
| JP | 2013-162073 A | 8/2013 |
| JP | 5608840 B1 | 10/2014 |
| WO | 2011/027831 A1 | 3/2011 |

\* cited by examiner

[Fig. 1]
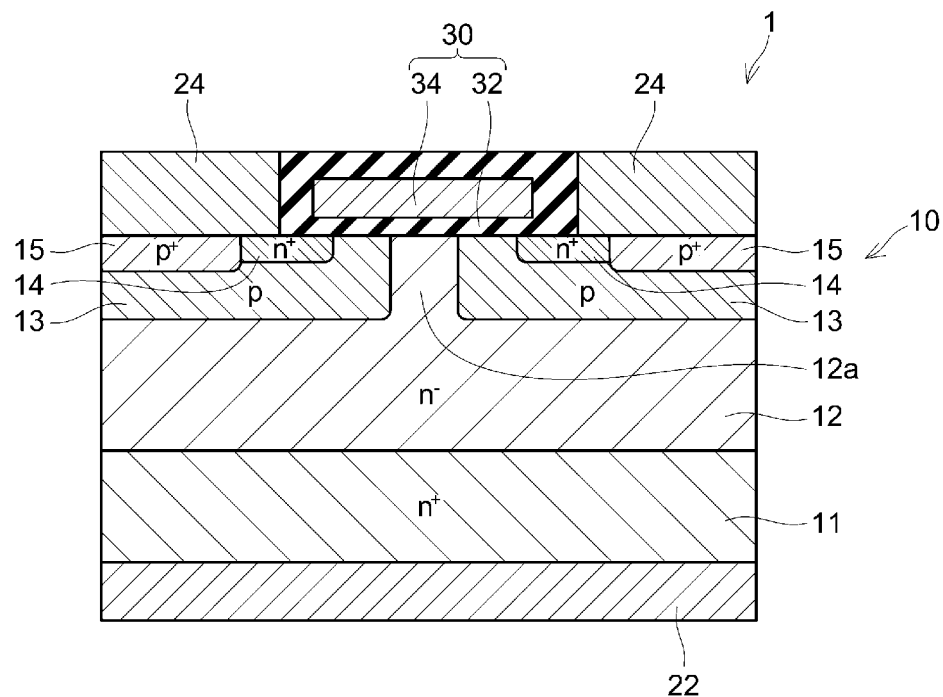
[Fig. 2]
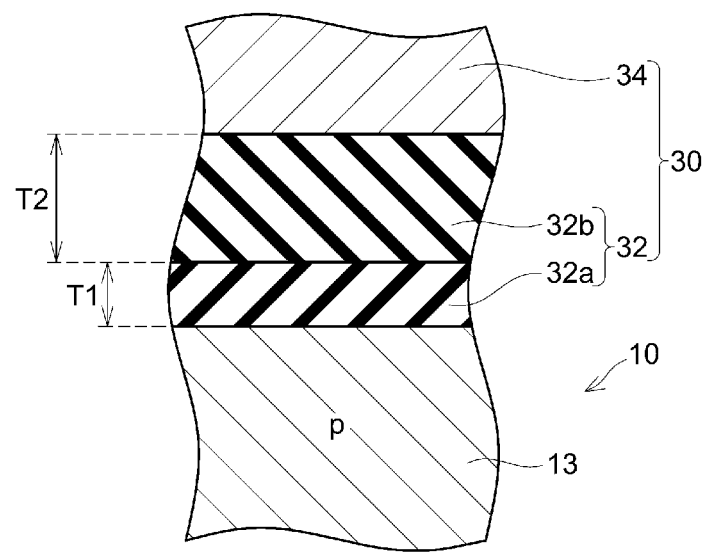

[Fig. 3]
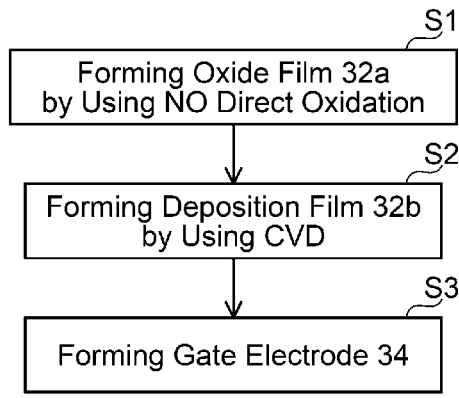
[Fig. 4]
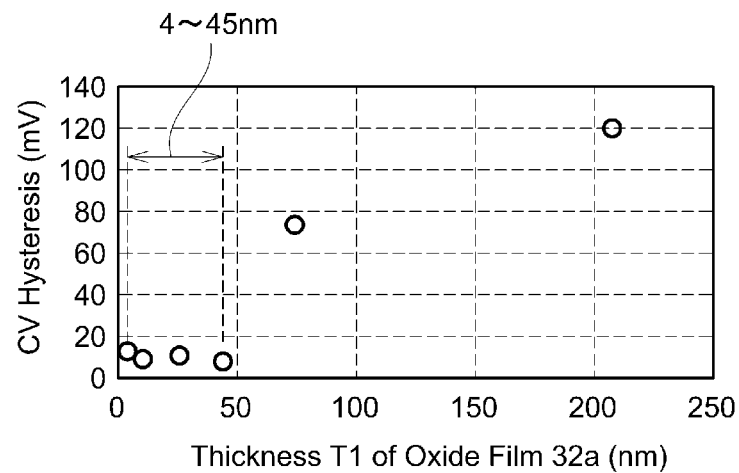
[Fig. 5]
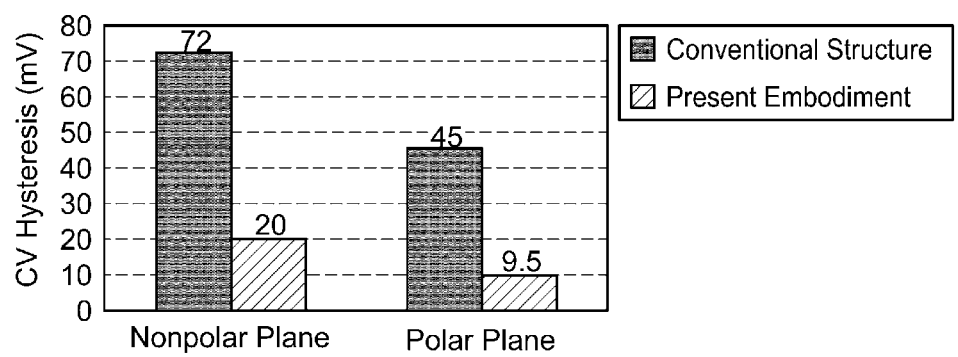

[Fig. 6]
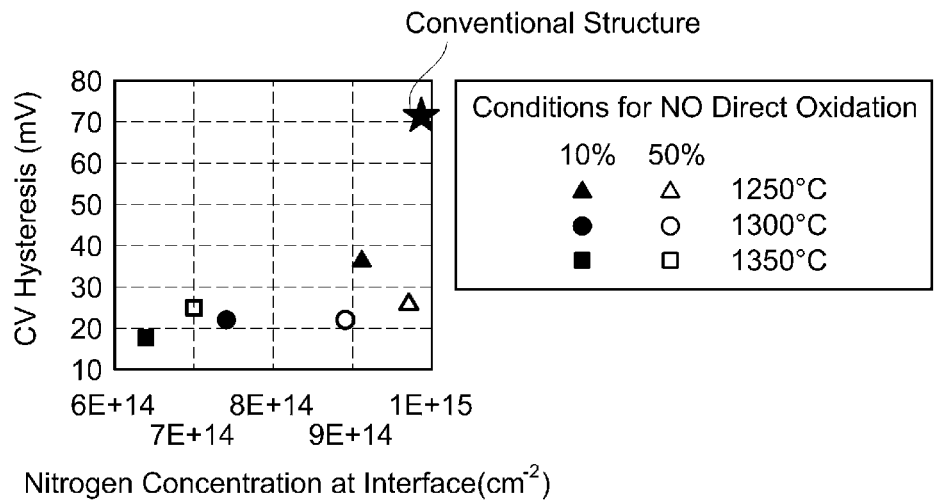
[Fig. 7]
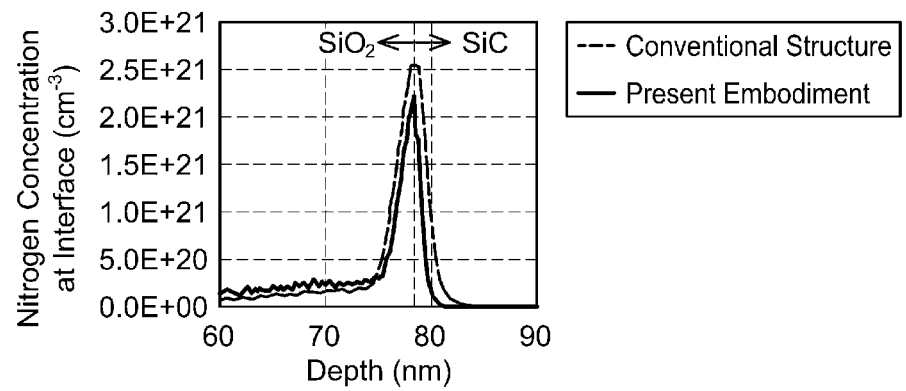
[Fig. 8]
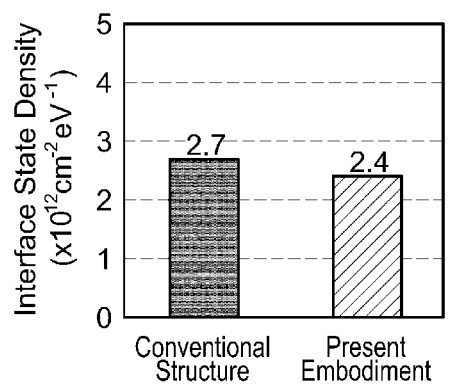

[Fig. 9]
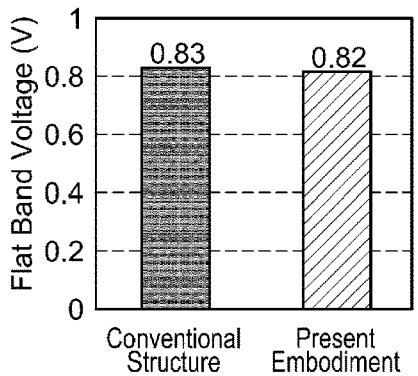
[Fig. 10]
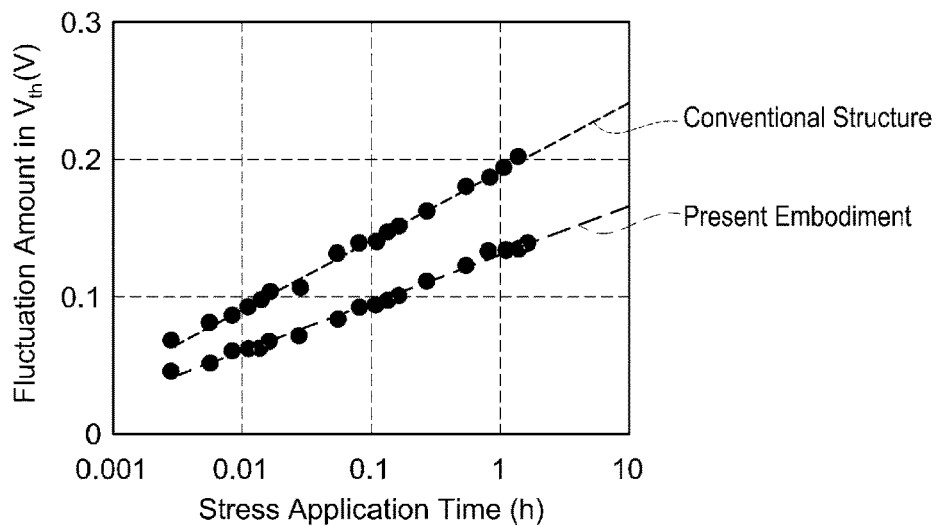
[Fig. 11]
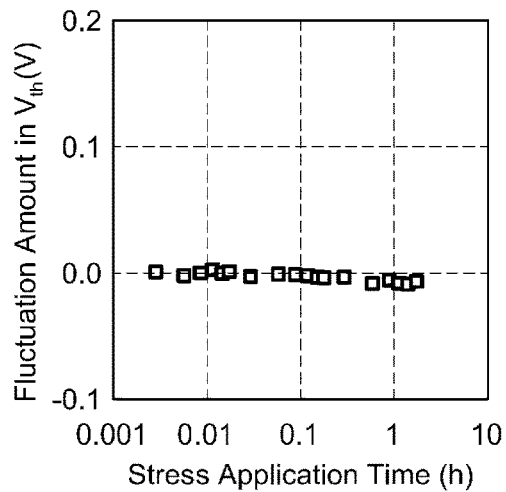

[Fig. 12]
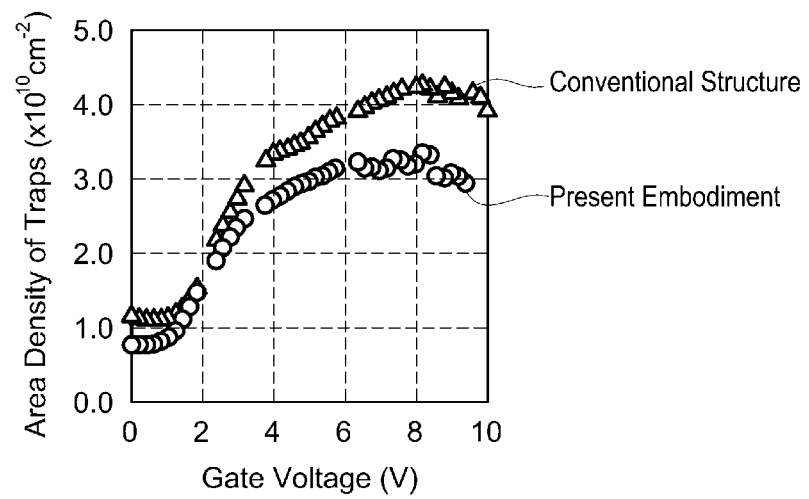

MANUFACTURING METHOD OF SILICON CARBIDE SEMICONDUCTOR DEVICE AND SILICON CARBIDE SEMICONDUCTOR DEVICE

CROSS-REFERENCE TO RELATED APPLICATION

This application claims priority to Japanese Patent Application No. 2018-026043 filed on Feb. 16, 2018, the contents of which are hereby incorporated by reference into the present application.

TECHNICAL FIELD

A technique disclosed herein relates to a manufacturing method of a silicon carbide semiconductor device. Further, a technique disclosed herein relates to a silicon carbide semiconductor device.

BACKGROUND ART

Silicon carbide semiconductor devices have been developed. To form an insulated gate, a manufacturing method of a silicon carbide semiconductor device includes forming a gate insulating film on a silicon carbide substrate and forming a gate electrode on the gate insulating film.

Japanese Patent No. 5608840 describes a technique of forming a gate insulating film constituted of an oxide film by thermally oxidizing a silicon carbide substrate. However, when the oxide film is formed by thermally oxidizing the silicon carbide substrate, a part of carbon in the silicon carbide substrate fails to sublime and remains in the oxide film. Carbon that remains in the oxide film within a few nanometers from an interface between the silicon carbide substrate and the oxide film, especially, is considered to contribute to generation of charge traps. Such charge traps are considered to cause fluctuations in a threshold voltage when a positive bias is applied to a gate electrode.

Japanese Patent No. 5608840 describes a technique of performing a nitriding treatment after the oxide film has been formed by thermally oxidizing the silicon carbide substrate. Japanese Patent No. 5608840 states that the nitriding treatment can decrease charge traps generated by carbon that remains at the interface between the silicon carbide substrate and the oxide film. In the nitriding treatment after the forming of the oxide film, however, there are problems that carbon still remains at the interface between the silicon carbide substrate and the oxide film due to a large film thickness of the formed oxide film and that carbon is newly generated due to the silicon carbide substrate being oxidized. Due to this, it is difficult for the technique in Japanese Patent No. 5608840 to favorably decrease charge traps in the oxide film of the insulated gate.

The disclosure herein aims to provide a technique of manufacturing a silicon carbide semiconductor device in which charge traps in an oxide film of an insulated gate is decreased.

SUMMARY OF INVENTION

A manufacturing method of a silicon carbide semiconductor device disclosed herein may comprise forming a gate insulating film on a silicon carbide substrate; and forming a gate electrode on the gate insulating film. The forming of the gate insulating film may comprise forming an oxide film on the silicon carbide substrate by thermally oxidizing the silicon carbide substrate under a nitrogen atmosphere. In this manufacturing method of the silicon carbide semiconductor device, the oxide film is formed by thermally oxidizing the silicon carbide substrate under the nitrogen atmosphere. Due to this, carbon in the silicon carbide substrate is combined with nitrogen, turns to carbon nitride gas and sublimes favorably, by which carbon is suppressed from remaining in the oxide film and charge traps in the oxide film are reduced.

BRIEF DESCRIPTION OF DRAWINGS

FIG. 1 schematically shows a cross-sectional view of a main part of a silicon carbide semiconductor device according to an embodiment.

FIG. 2 schematically shows an enlarged cross-sectional view of the main part in a vicinity of a channel of an insulated gate of the silicon carbide semiconductor device according to the present embodiment.

FIG. 3 shows a flowchart for a process of manufacturing the insulated gate of the silicon carbide semiconductor device according to the present embodiment.

FIG. 4 shows a relation between a thickness of an oxide film of the insulated gate and CV hysteresis in the silicon carbide semiconductor device according to the present embodiment.

FIG. 5 shows CV hysteresis when an insulated gate is formed on a polar plane and a nonpolar plane in each of the silicon carbide semiconductor device according to the present embodiment and a silicon carbide semiconductor device with a conventional structure.

FIG. 6 shows a relation between CV hysteresis and nitrogen concentration of an interface between a silicon carbide substrate and the oxide film, with a condition of NO direct oxidation varied.

FIG. 7 shows a profile of nitrogen concentration in a thickness direction in a vicinity of the interface between the silicon carbide substrate and the oxide film, in each of the silicon carbide semiconductor device according to the present embodiment and the silicon carbide semiconductor device with the conventional structure.

FIG. 8 shows interface state density of the interface between the silicon carbide substrate and the oxide film, in each of the silicon carbide semiconductor device according to the present embodiment and the silicon carbide semiconductor device with the conventional structure.

FIG. 9 shows flat band voltage of the insulated gate in each of the silicon carbide semiconductor device according to the present embodiment and the silicon carbide semiconductor device with the conventional structure.

FIG. 10 shows fluctuation amount in threshold voltage after application of a positive bias stress to the gate electrode based on threshold voltage before the application, in each of the silicon carbide semiconductor device according to the present embodiment and the silicon carbide semiconductor device with the conventional structure. (It should be noted that in the disclosure herein, "fluctuation amount of a threshold voltage after application of bias to the gate electrode" is calculated based on a threshold voltage before the application, and thus the description of "based on a threshold voltage before the application" will be omitted hereinbelow).

FIG. 11 shows fluctuation amount in threshold voltage after application of a negative bias stress to the gate electrode based on threshold voltage before the application, in the silicon carbide semiconductor device according to the present embodiment.

FIG. 12 shows area density of traps in the oxide film in the vicinity of the interface between the silicon carbide substrate and the oxide film, in each of the silicon carbide semiconductor device according to the present embodiment and the silicon carbide semiconductor device with the conventional structure.

DESCRIPTION OF EMBODIMENTS

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved silicon carbide semiconductor device, as well as methods for using and manufacturing a silicon carbide semiconductor device.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

As shown in FIG. 1, a silicon carbide semiconductor device 1 is a power semiconductor element referred to as a MOSFET (Metal Oxide Semiconductor Field Effect Transistor), and includes a silicon carbide substrate 10, a drain electrode 22 that covers a back surface of the silicon carbide substrate 10, a source electrode 24 that covers a part of a front surface of the silicon carbide substrate 10, and a planar-type insulated gate 30 provided at a part of the front surface of the silicon carbide substrate 10. The silicon carbide substrate 10 includes an $n^+$-type drain region 11, an $n^-$-type drift region 12, p-type body regions 13, $n^+$-type source regions 14, and $p^+$-type body contact regions 15.

The drain region 11 is disposed in a back layer portion of the silicon carbide substrate 10 and is disposed at the back surface of the silicon carbide substrate 10. The drain region 11 also serves as a base substrate for epitaxial growth of the drift region 12, which will be described later. The drain region 11 is in ohmic contact with the drain electrode 22 that coats the back surface of the silicon carbide substrate 10.

The drift region 12 is provided on the drain region 11 and includes an aperture portion 12a that is in contact with a part of a bottom surface of the insulated gate 30. The drift region 12 is formed by crystal growth on a front surface of the drain region 11 by using an epitaxial growth technique.

The body regions 13 are provided on the drift region 12 and are disposed in a front layer portion of the silicon carbide substrate 10. The body regions 13 are disposed with the aperture portion 12a of the drift region 12 interposed therebetween and each of the body regions 13 is in contact with a part of the bottom surface of the insulated gate 30. The body regions 13 are formed by introducing aluminum into the front layer portion of the silicon carbide substrate 10 by using an ion implantation technique.

The source regions 14 are provided respectively on the body regions 13, are disposed in the front layer portion of the silicon carbide substrate 10, and are exposed at the front surface of the silicon carbide substrate 10. The source regions 14 are separated from the drift region 12 by the body regions 13. The source regions 14 are formed by introducing nitrogen or phosphorus into the front layer portion of the silicon carbide substrate 10 by using an ion implantation technique. The source regions 14 are in ohmic contact with the source electrode 24 that coats the front surface of the silicon carbide substrate 10.

The body contact regions 15 are provided respectively on the body regions 13, are disposed in the front layer portion of the silicon carbide substrate 10, and are exposed at the front surface of the silicon carbide substrate 10. The body contact regions 15 are in contact with the body regions 13. The body contact regions 15 are formed by introducing aluminum into the front layer portion of the silicon carbide substrate 10 by using an ion implantation technique. The body contact regions 15 are in ohmic contact with the source electrode 24 that coats the front surface of the silicon carbide substrate 10.

The insulated gate 30 is provided at a part of the front surface of the silicon carbide substrate 10, and includes a gate insulating film 32 and a gate electrode 34. The gate insulating film 32 is provided on the front surface of the silicon carbide substrate 10 and is in contact with the front surface of the silicon carbide substrate 10. The gate electrode 34 is provided on a front surface of the gate insulating film 32 and is in contact with the gate insulating film 32. The gate electrode 34 is opposed to a portion of each body region 13 between the corresponding source region 14 and the aperture portion 12a of the drift region 12, via the gate insulating film 32. In the silicon carbide semiconductor device 1, the portions of the body regions 13 between the source regions 14 and the aperture portion 12a of the drift region 12 serve as channels.

FIG. 2 schematically shows an enlarged cross-sectional view of a main part of the insulated gate 30. FIG. 2 is the enlarged cross-sectional view of the main part in a vicinity of the channel in the body region 13. As shown in FIG. 2, the gate insulating film 32 includes an oxide film 32a and a deposition film 32b, and is constituted of a double-layer structure.

The oxide film 32a is in contact with the front surface of the silicon carbide substrate 10, and is disposed between the silicon carbide substrate 10 and the deposition film 32b. As described later, the oxide film 32a is formed by using a thermal oxidation, and is constituted of silicon oxide.

The deposition film 32b is in contact with a front surface of the oxide film 32a, and is disposed between the oxide film 32a and the gate electrode 34. As described later, the deposition film 32b is formed by using a vapor deposition such as a chemical vapor deposition (CVD), and is constituted of silicon oxide. In this example, a thickness T2 of the deposition film 32b is larger than a thickness T1 of the oxide film 32a.

A sum (T1+T2) of the thickness T1 of the oxide film 32a and the thickness T2 of the deposition film 32b, namely, a thickness of the gate insulating film 32 is equal to or greater than 50 nm and equal to or less than 100 nm. The thickness of the gate insulating film 32 within this range can ensure a desired gate capacitance while ensuring a withstand voltage of the gate insulating film 32.

The deposition film 32b may be constituted of a high dielectric-constant insulator which has a higher dielectric constant than silicon oxide, instead of silicon oxide. By constituting the deposition film 32b of the high dielectric-constant insulator, the gate capacitance of the gate insulating film 32 can be easily ensured, so the thickness T1 of the oxide film 32a can be decreased. Examples of the high dielectric-constant insulator include a SiON-based insulator and an $Al_2O_3$-based insulator. Moreover, the deposition film 32b may be formed by using an atomic layer deposition (ALT), instead of the CVD.

FIG. 3 shows a manufacturing process for the insulated gate 30 of the silicon carbide semiconductor device 1. Firstly, the oxide film 32a is formed on the front surface of the silicon carbide substrate 10 by using a thermal oxidation under an atmosphere of nitric oxide (hereinafter referred to as "NO direct oxidation") (S1). Next, the deposition film 32b is formed on the front surface of the oxide film 32a by using the CVD (S2). Then, the gate electrode 34 is formed on a front surface of the deposition film 32b (S3). Through these steps, the insulated gate 30 of the silicon carbide semiconductor device 1 is formed.

FIG. 4 shows a relation between CV hysteresis and the thickness T1 (see FIG. 2) of the oxide film 32a which is formed by using the NO direct oxidation. Here, an expression shown below is established, where $Q_{OT}$ represents charged traps in the gate insulating film 32, $C_{OX}$ represents a capacitance of the gate insulating film 32, and dV represents a CV hysteresis.

$$Q_{OT}=C_{OX} \times dV \quad (1)$$

As shown in Expression 1, the charged traps $Q_{OT}$ in the gate insulating film 32 are proportional to the CV hysteresis dV. As shown in FIG. 4, it was found that the CV hysteresis dV is suppressed low and the charged traps $Q_{OT}$ are suppressed low with the thickness T1 of the oxide film 32a of the gate insulating film 32 equal to or greater than 4 nm and equal to or less than 45 nm.

The charged traps $Q_{OT}$ are considered to be generated by a part of carbon in the silicon carbide substrate 10 failing to sublime when the oxide film 32a is formed on the front surface of the silicon carbide substrate 10 and remaining within a few nanometers from an interface between the silicon carbide substrate 10 and the oxide film 32a. In the present embodiment, the oxide film 32a is formed by using the NO direct oxidation, as described above. Therefore, when the oxide film 32a is formed on the front surface of the silicon carbide substrate 10, a part of carbon in the silicon carbide substrate 10 combines with nitrogen in the nitric oxide, turns into carbon nitride gas and favorably sublimes, by which carbon is suppressed from remaining in the oxide film 32a. Consequently, the charged traps $Q_{OT}$ in the oxide film 32a are considered to be suppressed low. Setting the thickness T1 of the oxide film 32a to be equal to or greater than 4 nm, especially, can decrease an amount of carbon remaining within a few nanometers from the interface between the silicon carbide substrate 10 and the oxide film 32a, so generation of the charged traps $Q_{OT}$ can effectively be suppressed. However, setting the thickness T1 of the oxide film 32a to be greater than 45 nm is considered to hinder sublimation of carbon in the silicon carbide substrate 10. Therefore, the thickness T1 of the oxide film 32a is desirably in a range equal to or greater than 4 nm and equal to or less than 45 nm.

Furthermore, forming the oxide film 32a by using the NO direct oxidation can terminate dangling bonds of silicon in the silicon carbide substrate 10 without using an excessive amount of nitrogen. For example, in a conventional technique, a nitriding treatment is performed to terminate dangling bonds after a gate insulating film has been formed on a silicon carbide substrate. In this case, there is a problem that an amount of remaining carbon is increased due to an excessive amount of nitrogen being introduced into an interface between the silicon carbide substrate and the gate insulating film and due to the introduced nitric oxide oxidizing the silicon carbide substrate. Furthermore, there is a concern that the nitrogen introduced into the interface between the silicon carbide substrate and the gate insulating film may become a source of hole traps and may increase a fluctuation amount of a threshold voltage after application of a negative bias to the gate electrode. On the other hand, with the technique using the NO direct oxidation of the present embodiment, an excessive amount of nitrogen is discharged without an excessive amount of the nitrogen being introduced into the interface between the silicon carbide substrate 10 and the gate insulating film 32. The above problems caused by the excessive amount of nitrogen are thereby prevented.

Some properties of the insulated gate 30 that includes the oxide film 32a formed by using the NO direct oxidation will hereinafter be described. A conventional structure mentioned below is an example of an insulated gate that includes a gate insulating film formed by performing a nitriding treatment after an oxide film has been formed only by using a CVD. The oxide film in the conventional structure has a thickness of 80 nm.

(Plane Orientation Dependence)

Silicon carbide has different atomic arrangements depending on plane orientations, and thus it has a nonpolar plane (an m-plane or an a-plane) and a polar plane (a Si-plane or a C-plane). As shown in FIG. 5, it was found that the present embodiment exhibits lower CV hysteresis than the conventional structure in both cases of polar and nonpolar planes. In the data shown in FIG. 5, the insulated gate 30 of the present embodiment includes the oxide film 32a having the thickness T1 of 10 nm.

(Manufacturing Conditions with NO Direct Oxidation)

FIG. 6 shows a relation between CV hysteresis and nitrogen concentration at the interface between the silicon carbide substrate 10 and the oxide film 32a, with a manufacturing condition with the NO direct oxidation (a gas concentration of nitric oxide and a thermal oxidation temperature) varied. The nitrogen concentration was measured by using a secondary ion mass spectrometry. As shown in FIG. 6, it was found that the insulated gate 30 in the present embodiment exhibits lower CV hysteresis than the conventional structure, under any of the manufacturing conditions. Furthermore, it was found that the nitrogen concentration at the interface in the present embodiment is much lower than that in the conventional structure, under the manufacturing condition in which the gas concentration of nitric oxide gas is equal to or greater than 10% and the thermal oxidation temperature is equal to or greater than 1300 degrees Celsius. As such, in the technique using the NO direct oxidation, it is suggested that nitrogen required for the dangling bonds of silicon in the silicon carbide substrate 10 is took in without deficiency or excess, and thus an excessive amount of nitrogen is not introduced into the interface between the silicon carbide substrate 10 and the gate insulating film 32. In the data shown in FIG. 6, the insulated gate 30 of the present embodiment includes the oxide film 32a having the thickness T1 of 10 nm.

(Profile of Nitrogen Concentration over Depths)

FIG. 7 shows a profile of nitrogen concentration in a depth direction of the silicon carbide substrate 10 and the gate insulating film 32. A depth of approximately 78 nm corresponds to a depth of the interface between the silicon carbide substrate 10 (denoted as SiC in FIG. 7) and the gate insulating film 32 (denoted as $SiO_2$ in FIG. 7). As in the result in FIG. 6, it was also found in the data shown in FIG. 7 that the nitrogen concentration in the depth direction in a vicinity of the interface between the silicon carbide substrate 10 and the gate insulating film 32 of the present embodiment is lower than that in the conventional structure. In the data shown in FIG. 7, the insulated gate 30 of the present embodiment includes the oxide film 32a having the thickness T1 of 10 nm.

(Interface State Density)

FIG. 8 shows interface state density measured by the Terman method. The interface state density is considered to correlate with mobility of carriers that travel through channels. As shown in FIG. 8, it was found that the interface state density in the present embodiment is comparable to that in the conventional structure. As such, it is suggested that the technique using the NO direct oxidation can sufficiently decrease defects at the interface between the silicon carbide substrate 10 and the gate insulating film 32. In the data shown in FIG. 8, the insulated gate 30 of the present embodiment includes the oxide film 32a having the thickness T1 of 10 nm.

(Flat Band Voltage)

FIG. 9 shows measured flat band voltage. The flat band voltage is considered to correlate with a threshold voltage. As shown in FIG. 9, it was found that the flat band voltage in the present embodiment is comparable to that in the conventional structure. In the data shown in FIG. 9, the insulated gate 30 of the present embodiment includes the oxide film 32a having the thickness T1 of 10 nm.

(Fluctuation Amount in Threshold Voltage Caused by Positive Bias Stress)

FIG. 10 shows fluctuation amount in threshold voltage after application of a positive bias stress to the gate electrode 34. The positive bias stress applied is 25 V. As shown in FIG. 10, it was found that the fluctuation amount in the threshold voltage in the present embodiment is smaller than that in the conventional structure. The present embodiment has the interface state of $2.1 \times 10^{12}$ $cm^{-2}$ $eV^{-1}$ and the mobility of 10 $cm^2/Vs$. The conventional structure has the interface state of $2.1 \times 10^{12}$ $cm^{-2}$ $eV^{-1}$ and the mobility of 9.8 $cm^2/Vs$. As such, the present embodiment and the conventional structure have no difference in interface state and mobility. Meanwhile, it was found that the fluctuation amount in the threshold voltage under the positive bias stress is suppressed in the present embodiment.

(Fluctuation Amount in Threshold Voltage Caused by Negative Bias Stress)

FIG. 11 shows fluctuation amount in threshold voltage after application of a negative bias stress to the gate electrode 34. The negative bias stress applied is −10 V. As shown in FIG. 11, it was found that the fluctuation amount in the threshold voltage in the present embodiment is extremely small. As described above, it is concerned that nitrogen introduced into the interface between the silicon carbide substrate and the gate insulating film may be a source of hole traps and the fluctuation amount in threshold voltage after the application of a negative bias stress to the gate electrode may increase. On the other hand, in the technique using the NO direct oxidation, an excessive amount of nitrogen is not introduced into the interface between the silicon carbide substrate 10 and the gate insulating film 32. Due to this, it is suggested that the fluctuation amount in the threshold voltage under the negative bias stress is suppressed.

(Area Density of Traps)

FIG. 12 shows area density of traps for charges, which was measured by using a capacitance transient method, within the oxide film 32a in the vicinity of the interface between the silicon carbide substrate 10 and the oxide film 32a. As shown in FIG. 12, it was found that the area density of traps in the present embodiment is smaller than that in the conventional structure.

Based on these results, the silicon carbide semiconductor device 1 of the present embodiment includes at least the following features.

(1) The technique using the NO direct oxidation decreases charge traps in the oxide film 32a, by which the fluctuation amount in the threshold voltage under the positive bias stress can be suppressed.

(2) The technique using the NO direct oxidation suppresses introduction of an excessive amount of nitrogen into the gate insulating film 32, by which the fluctuation amount in the threshold voltage under the negative bias stress can be suppressed.

(3) The present embodiment has the interface state density between the silicon carbide substrate 10 and the oxide film 32a that is comparable to that in the conventional structure, and has a sufficiently low density of defects.

Some of the features characteristic to above-described embodiment will herein be listed. It should be noted that the respective technical elements are independent of one another, and are useful solely or in combinations. The combinations thereof are not limited to those described in the claims as originally filed.

As a silicon carbide semiconductor device disclosed herein, a MOSFET (Metal Oxide Semiconductor Field Effect Transistor) and an IGBT (Insulated Gate Bipolar Transistor) are exemplified. A manufacturing method of a silicon carbide semiconductor device disclosed herein may comprise forming a gate insulating film on a silicon carbide substrate; and forming a gate electrode on the gate insulating film. An insulated gate including the insulating film and the gate electrode may be of a planar type that is provided on a front surface of a silicon carbide substrate. Alternatively, the insulated gate may be of a trench type that is provided in a trench in a front layer portion of a silicon carbide substrate. The forming of the gate insulating film may comprise forming an oxide film on the silicon carbide substrate by thermally oxidizing the silicon carbide substrate under a nitrogen atmosphere.

In the above manufacturing method, a thickness of the oxide film may be equal to or greater than 4 nm and equal to or less than 45 nm. By setting the thickness of the oxide film within such a range, carbon can favorably be suppressed from remaining in the oxide film, as a result of which charge traps in the oxide film can be decreased favorably.

In the above manufacturing method, the forming of the oxide film may be performed under the nitrogen atmosphere including nitric oxide gas. Thermal oxidization under the nitrogen atmosphere including nitric oxide gas can favorably terminate dangling bonds of silicon in the silicon carbide substrate.

In the above manufacturing method, the forming of the oxide film may be performed under a condition in which a gas concentration of the nitric oxide gas is equal to or greater than 10% and a thermal oxidation temperature is equal to or greater than 1300 degrees Celsius. The forming of the oxide film under such a manufacturing condition can suppress an excessive amount of nitrogen from being introduced into the oxide film. Due to this, a fluctuation amount in a threshold voltage after application of a negative bias stress to the gate electrode can be suppressed.

In the above manufacturing method, the forming of the gate insulating film may further comprise forming a deposition film of an insulator on the oxide film. By forming such a deposition film, the thickness of the oxide film can be reduced while ensuring a thickness necessary to the gate insulating film. Since the thickness of the oxide film can be reduced, carbon of the silicon carbide substrate can favorably sublime when the oxide film is formed by thermal oxidization. A chemical vapor deposition or an atomic layer deposition may be used in the forming of the deposition film.

In the above manufacturing method, the deposition film may have a higher dielectric constant than the oxide film. By constituting the deposition film of such a high dielectric-constant insulator, a gate capacitance of the gate insulating film can be ensured by the deposition film, by which the thickness of the oxide film can be reduced. Since the thickness of the oxide film can be reduced, carbon of the silicon carbide substrate can favorably sublime when the oxide film is formed by thermally oxidization.

A silicon carbide semiconductor device disclosed herein may comprise a silicon carbide substrate, a gate insulating film provided on the silicon carbide substrate, and a gate electrode provided on the gate insulating film. An insulated gate including the gate insulating film and the gate electrode may be of a planar type that is provided on a front surface of the silicon carbide substrate. Alternatively, the insulated gate may be of a trench type that is provided in a trench in a front layer portion of the silicon carbide substrate. The gate insulating film may comprise an oxide film provided on the silicon carbide substrate and a deposition film provided on the oxide film.

In the above silicon carbide semiconductor device, a thickness of the oxide film may be thinner than a thickness of the deposition film. Further, the thickness of the oxide film may be equal to or greater than 4 nm and equal to or less than 45 nm. Carbon can be favorably suppressed from remaining in the oxide film having a thickness adjusted within such a range, as a result of which charge traps in the oxide film can be decreased favorably.

In the above silicon carbide semiconductor device, the deposition film may have a higher dielectric constant than the oxide film. By constituting the deposition film of such a high dielectric-constant insulator, a gate capacitance of the gate insulating film can be ensured by the deposition film, by which the thickness of the oxide film can be reduced. Carbon can be favorably suppressed from remaining in the oxide film having a reduced thickness, as a result of which charge traps in the oxide film can be decreased favorably.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A manufacturing method of a silicon carbide semiconductor device, the manufacturing method comprising:
   forming a gate insulating film on a silicon carbide substrate; and
   forming a gate electrode on the gate insulating film,
   wherein
   the forming of the gate insulating film comprises forming an oxide film on the silicon carbide substrate by thermally oxidizing the silicon carbide substrate under a nitrogen atmosphere,
   the forming of the oxide film is performed under the nitrogen atmosphere including nitric oxide gas, and
   the forming of the oxide film is performed under a condition in which a gas concentration of the nitric oxide gas is equal to or greater than 10% and a thermal oxidation temperature is equal to or greater than 1300 degrees Celsius.

2. The manufacturing method according to claim 1, wherein
   a thickness of the oxide film is equal to or greater than 4 nm and equal to or less than 45 nm.

3. The manufacturing method according to claim 1, wherein
   the forming of the gate insulating film further comprises forming a deposition film of an insulator on the oxide film.

4. The manufacturing method according to claim 3, wherein
   a chemical vapor deposition or an atomic layer deposition is used in the forming of the deposition film.

5. The manufacturing method according to claim 3, wherein
   the deposition film has a higher dielectric constant than the oxide film.

* * * * *